United States Patent [19]

Gerard et al.

[11] 4,226,569
[45] Oct. 7, 1980

[54] WAFER LOADING AND POSITIONING DEVICE

[75] Inventors: René Gerard; Michel Lacombat, both of Paris, France

[73] Assignee: Thomson-CSF, Paris, France

[21] Appl. No.: 897,537

[22] Filed: Apr. 17, 1978

[30] Foreign Application Priority Data

Apr. 20, 1977 [FR] France .................. 77 11909

[51] Int. Cl.² ................ F23Q 3/04; F25B 11/00
[52] U.S. Cl. ................................ 414/737; 248/181; 269/21; 269/75; 269/329; 414/754; 414/783
[58] Field of Search ............ 414/737, 754, 779, 783, 414/787; 406/87; 29/625; 269/21, 75, 321 WE; 248/181, 182, 188.2, 188.3, 412; 96/36.2

[56] References Cited

U.S. PATENT DOCUMENTS

| | | | |
|---|---|---|---|
| 2,993,395 | 7/1961 | Bohn | 269/75 |
| 3,711,081 | 1/1973 | Cashon | 269/21 |
| 3,894,636 | 7/1975 | Tonus | 414/737 |
| 3,969,004 | 7/1976 | Schliemann | 269/75 X |

FOREIGN PATENT DOCUMENTS 2307826  8/1974  Fed. Rep. of Germany .......... 248/181

*Primary Examiner*—L. J. Paperner
*Attorney, Agent, or Firm*—Cushman, Darby & Cushman

[57] ABSTRACT

The present invention relates to the precise positioning of a body exhibiting a flat face, said latter requiring to be aligned, or in other words brought into coincidence with a mechanically indexed reference plane. The loading device in accordance with the invention comprises a levelling stage associated with a loading flap which can pivot about an axis. The stage comprises a base containing a cylindrical bore, and a lockable supporting stand equipped with a spherical-walled sleeve located in said cylindrical bore. The flap and the stage are equipped with mechanical indexing means which cooperate with those defining the reference plane.

15 Claims, 6 Drawing Figures

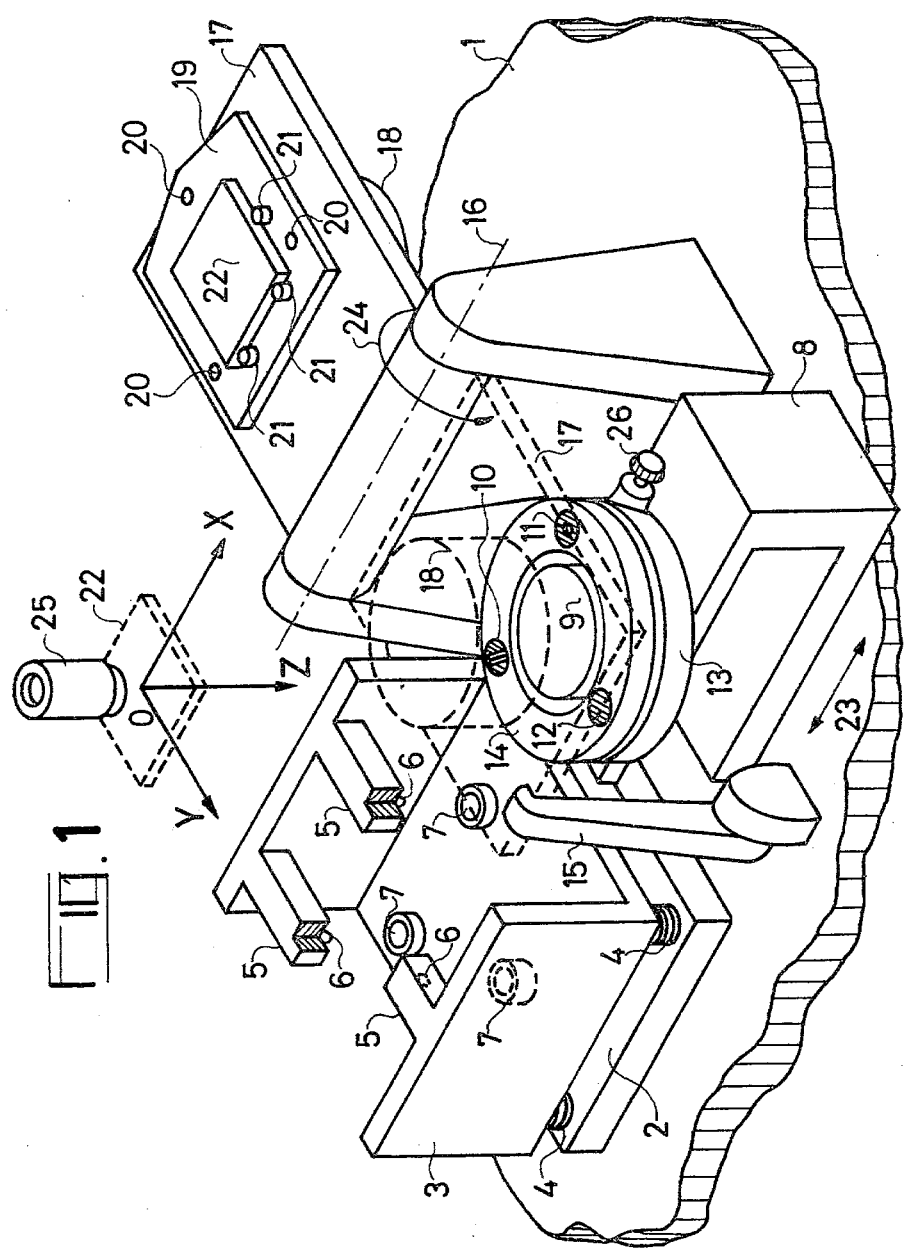

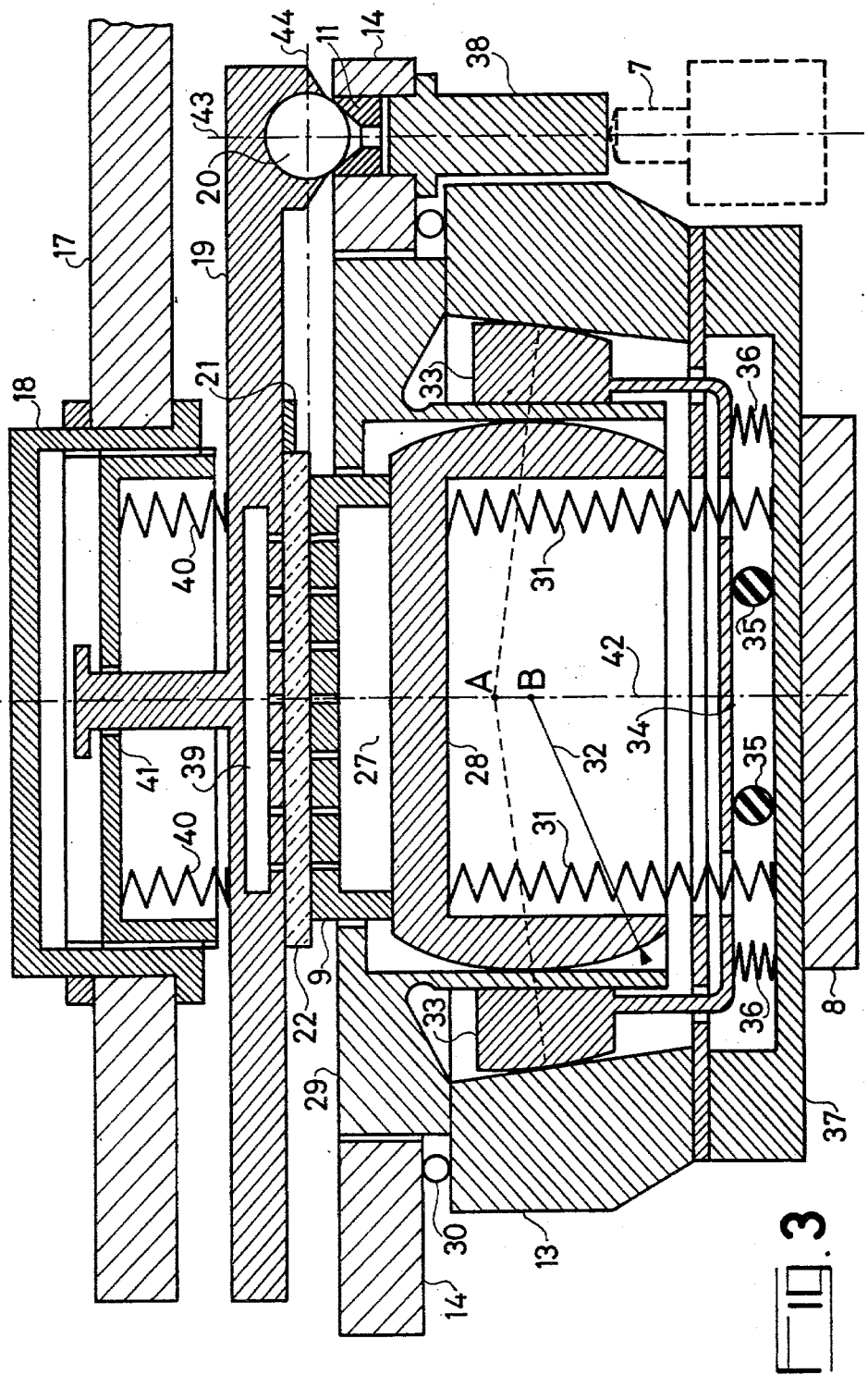

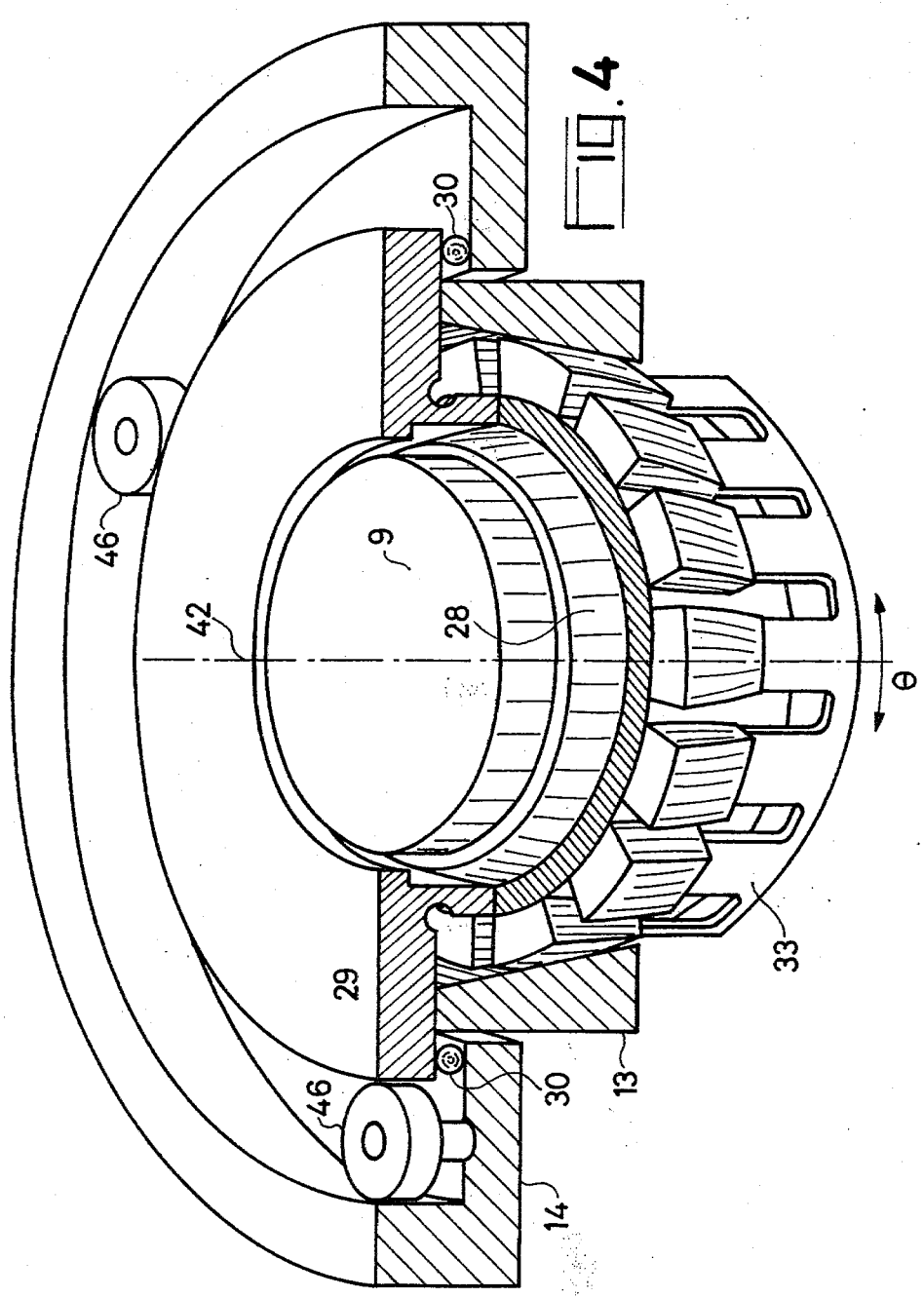

WAFER LOADING AND POSITIONING DEVICE

The present invention relates to a loading device intended to carry a body in a position such that a flat face of the latter, opposite to the face through which it is supported, can be positioned in precise coincidence with a reference plane defined by an appropriate mechanical indexing means. This kind of device finds particular application in the field of photo-repeater devices used in masking techniques. The photo-repeater device is an optical projection system in which the reduced image of a design or pattern can be projected onto a large number of adjacent areas of a photosensitive layer or film generally deposited on the flat face of a substrate wafer.

The wafer carries on one of its faces the photosensitive layer or film and rests through its other face on a supporting stand. Since the wafer has only one precision-machined face, it is necessary to provide for adjustment of the attitude of the photosensitive film and also adjustment of the distance separating the film from the projection objective lens. In the absence of these critical adjustments, the sharpness of the projected images will be totally compromised.

In a situation where a photo-repeater device is used to produce a mask, the aforesaid adjustments need making only once. By contrast, if the situation involved is that of the direct photo-repetition of a chip of semiconductor material, several successive masks are generally required and this requires fresh adjustment of the chip in terms of attitude and distance, with each passage through the photo-repeater system. These adjustments, which are performed manually, are extremely delicate and require a highly skilled and attentive operator. Self-evidently, these adjustments are not specific to the kinds of photo-repeater systems used to manufactures integrated circuits; one can also point to the situation in which they are required in machines used to cut diffraction gratings and in optical instruments which employ objective lenses of large numerical aperture for the purpose of the display or recording of structures containing very fine detail.

In order to facilitate the operations of positioning a body with a flat face, the present invention proposes a levelling stage by means of which a supporting stand can be locked in relation to a base, by a single operation; said supporting stand, in the absence of said control operation can simultaneously pivot about a centre and slide in said base so that said centre has only one degree of freedom in relation to the base.

In accordance with the present invention, there is provided a loading device for positioning a body having a flat face in a position such that said flat face coincides with a mechanically indexed reference plane, said device comprising: a mounting frame carrying mechanical indexing means defining said reference plane, a levelling stage for supporting said body, and fitting means for setting down said flat face in said position; said levelling stage comprising a base member, and a flat topped supporting member; said base member being provided with a cylindrical bore, and said supporting member having a spherical bearing surface slidably mounted within said cylindrical bore; said levelling stage further comprising repulsion means for pushing said supporting member away from the bottom of said base member, and straining means for controlling the amount of clamping of said members.

For a better understanding of the present invention and to show how the same may be carried into effect reference will be made to the ensuing description and the attached figures among which:

FIG. 1 is an isometric view of a loading device in accordance with the invention;

FIGS. 2(a)-(c) show three essential phases involved in the operation of the device shown in FIG. 1;

FIG. 3 is a sectional view of a levelling stage and of a pivoting flap used to load the latter;

FIG. 4 is a partial isometric view of the component elements of the stage shown in FIG. 3.

Figure 2A:
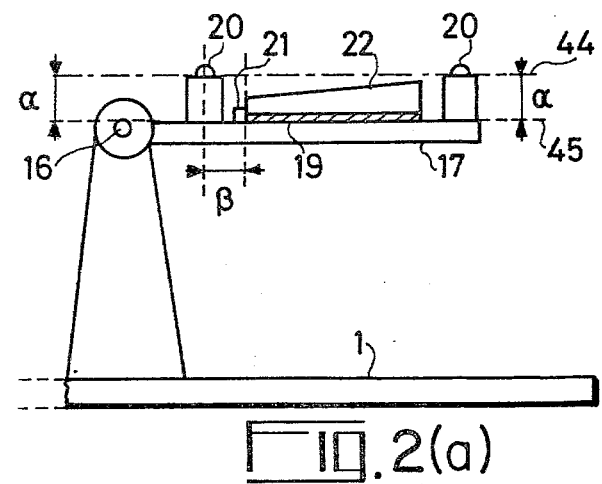

FIG. 1 is an isometric view showing the design of the elements used to position a body 22 whose flat face (not visible), resting on the base 19, is to be brought into alignment with a reference plane XOY. In order to illustrate this final stage of alignment or in other words coincidence, the outline of the body 22 has been shown in dotted fashion, it being understood of course that in this final position it is the initially hidden flat face which is contained in the system of coordinates XOY. By way of non-limitative example, the body 22 will be assumed to take the form of a plate. In the case of the technique of masking production of electronic components and circuits, the plate 22 may take the form of transparent or semiconductive material with a fully finished face upon which a photosensitive layer such as a photographic emulsion or a photoresist, has been deposited. The elements of FIG. 1 can therefore form part of an optical system for projecting designs or patterns and, assuming the case of multiple manufacture, this optical system will constitute a photo-repeater device. In the ensuing description, the basic application chosen is that which consists in placing upon a photo-repeater device, a plate which is designed to be optically impressed with the image of a pattern projected in the plane XOY by an objective lens 25 of optical axis OZ. It goes without saying that this descriptive framework is in no way limitative of the scope of the invention. The plate 22 could just as well carry a pattern and constitute the object whose image is formed by the objective lens 25. Similarly, the plate 22 could equally well be a specimen and the objective lens 25 could be an optical element of a microscope intended for the observation of the specimen. Finally, any machine designed to machine the flat face of a component, could be equipped with a loading arrangement of the kind shown in FIG. 1.

In FIG. 1, there can be seen a fragment of a bench 1, upon which there is assembled a carriage 2 capable of displacing in the X and Y directions. A mounting frame 3 rests upon the carriage 2 through the medium of several stacks of piezoelectric elements 4 which are supplied with voltages designed to correct attitude errors on the part of the frame 3, this both in terms of height and horizontal trim (this latter hitherto referred to generically as "attitude"). These errors occur in relation to the reference plane XOY when the carriage 2 displaces within the boundary of the bench 1. The lugs of the frame 3 carry stubs 5 to which there are attached mechanical indexing means comprising three balls 6 of the same diameter. The triangle whose corners are defined by the centres of the three balls 6 defines a plane which is maintained parallel to the plane XOY under the corrective action of the piezoelectric stacks 4. In the same way, the distance $a$ separating the plane XOY from the plane mechanically indexed by the balls 6, is rendered invariable whatever the position occupied by the carriage 2 on the bench 1. The base of the frame 3 is equipped with a set of jacks 7 whose rams move upwards towards the balls 6 under the effect of a vacuum control arrangement.

A levelling stage comprising a base member 13, a ring 14 and a flat topped supporting member 9, can be engaged in the frames 3 between the jacks 7 and the stubs 5. To this end, the levelling stage is assembled on a transfer carriage 8 which displaces it in the direction 23. The ring 14 of the levelling stage is equipped with mechanical indexing means 10, 11 and 12 designed to engage with the balls 6 when the stage has been introduced into the frame and subsequently lifted by the jacks 7. These mechanical indexing means comprise a seating arrangement of the point, line, surface kind which comprises a stud 12 with a flat face, a stud 10 equipped with a straight groove and a stud 11 equipped with a conical recess. The pneumatic control of the jacks is contrived in such a manner that one of the balls 6 locates in the stud 11 before its neighbour locates in that 10. The last ball 6 arriving in position on the stud 12 brings about positioning of the levelling stage in the frame 3. A control knob 26 makes it possible to pivot the ring 14 in relation to the base 13 of the stage. Since the stage is positioned in the frame 3 and the flat topped supporting member 9 is connected to the base 13, pivoting produced by operation of the knob 26 is translated into a rotation of member 9 about an axis parallel to the optical axis OZ of the objective lens 25.

In order to facilitate loading of the levelling stage, a flap 17 pivoting about an axis 16 is designed to apply the plate 22 against the flat topped member 9 after having executed a pivoting motion 24 which brings it into the position shown in broken-line. In this latter position, the flap 17 is held by a locking lever 15. The pivoting flap 17 receives the plate 22 when occupying the position shown in full line. It is equipped with a slab 19 whose perfectly trued central portion constitutes a loading area. Stops 21 arranged at the edge of the loading area make it possible to centre the plate 22. The slab 19 is not rigidly attached to the pivoting flap 17; it can be detached from it under the control of the handle 18. The attachment between the slab 19 and the flap 17 is an elastic, floating one. Moreover, the slab 19 is equipped with mechanical indexing means 20 matching those of the frame 3.

By design, it can be arranged that the triangle whose corners are defined by the centres of three balls 20, defines a plane parallel to the loading area, located at a distance $\alpha$ from said area.

Figure 2B:
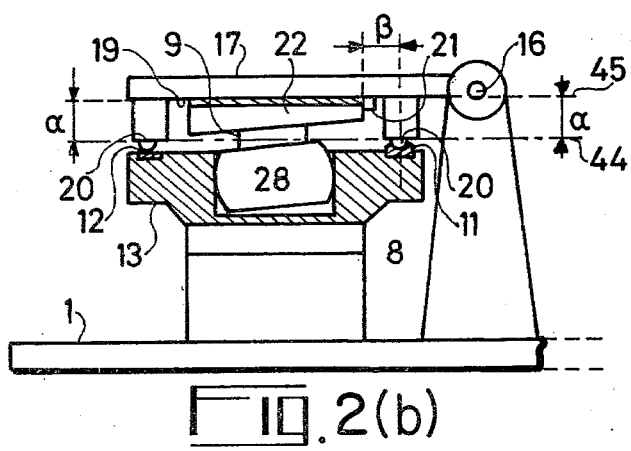
Figure 2C:
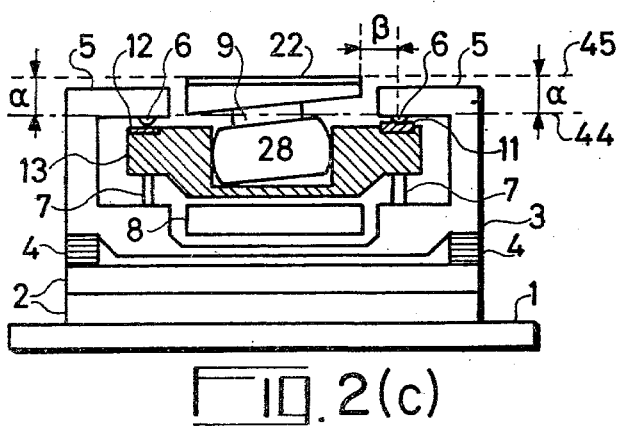

The operation of the loading device shown in FIG. 1 can be understood from a consideration of FIG. 2 in which the references used are to a large extent the same as before. It will be observed however, that in order to simplify the drawing the ring 14 has been assumed to be part and parcel of the base 13. This has been shown in section in order to show a sleeve 28 with a spherical bearing surface, integral with the flat topped member 9. The plate 22 has been shown provided on its flat face with a cross-hatched photosensitive film or layer. The supporting face of the plate 22, opposite to the face carrying the photosensitive film, has been drawn obliquely since it is unnecessary to arrange for it to be parallel with the film or to arrange for a precise spacing to be complied with.

As shown at (a) in FIG. 2, the first phase of loading consists in placing the plate 22 on the pivoting flap 17 which has been swung about the axis 16 in order to give access from above to the loading area of the slab 19, to the mechanical indexing means 20 and to the stops 21. The loading area is coincidental with a plane 45 shown in broken line and this plane itself coincides with the free surface of the photosensitive film deposited upon the plate 22. The centres of the balls 20 define a plane 44 shown in chain-dotted line, arranged at a distance $\alpha$ from the plane 45. The parallelism of the interval $\alpha$ between the two planes 45 and 44 are adjusted with high precision. The plate 22 is thrust into contact with the stops 21 so that the distance $\alpha$ between its edge and one of the balls 20 has a well-defined value which can easily be repeated during successive positioning operations. When the plate 22 has been placed in position on the slab 19, it is held there by some appropriate means or other, for example by suction which involves connecting the loading area to a reservoir which is at a pressure lower than atmospheric. At this stage, the pivoting flap 17 can be swung into the position shown at (b) in FIG. 2. The balls 20 are then placed opposite the studs 10, 11, 12 carried by the levelling stage. The flap 17 is held in this position by means of the locking lever 15. The member 9 and the sleeve 28 of the plate can slide freely in the location provided in the base 13 and, under the effect of the force exerted by springs, they emerge as high as possible from the stage. The slab 19 carried by the flap 17 is also in a high position so that the supporting surfaces of the plate 22 and the member 9 are not in contact. To bring this contact about, the knob 18 is operated in order to lower the slab 19. During a first phase, contact between the supporting face of the plate 22 and the member 9 forces the latter to adopt the same attitude as the former and move down into the base 18. During a second phase, the balls 20 come into precise engagement with the studs 10, 11 and 12 carried by the stage. At this point, the plate 22 can be released from the loading area by cutting off the vacuum which holds it in contact with the slab 19. Before the flap 17 can be lifted away again, the sleeve 28 must be secured to the base 13 by radial contraction of the cylindrical location which it contains. It must therefore be ensured that the plate 22 is fixed to the member 9 and this operation can be performed by the application of vacuum. As we shall see at a later point in this description, the locking of the sleeve 28 in the base 13 can also be brought about by vacuum control.

At (c), FIG. 2 illustrates the end of the loading phase. The flap 17 has been swung back into the position which it occupied at (a), and the stage has been moved into the supporting frame 3. The jacks 7 have lifted the stage away from its transfer carriage 8 and brought it into the final position in which there is engagement between the studs 10, 11 and 12 and the balls 6 integral with the frame 3.

It will readily be appreciated that during the loading process, parallelism between the planes 44 and 45 has been fully maintained as also have the distances $\alpha$ and $\beta$ which ensure full accuracy of positioning of the photosensitive film carried by the plate 22.

The sectional view of FIG. 3 illustrates, by way of non-limitative example, an embodiment of the levelling stage and of the pivoting flap used in the positioning device in accordance with the invention.

The flat topped member 9 of the stage has a stand designed to receive the supporting face of the plate 22. A vacuum chamber 27 formed in the member 9 makes it possible by suction effect to hold the plate 22 in position. The flat topped member 9 is integral with a sleeve 28 having a spherical bearing surface which can slide in the cylindrical bore formed in a member 29 integral with the base 13. The centre of pivoting B of the sleeve 28 can therefore displace along the axis 42 of the cylindrical bore in the member 29. The member 29 comprises a ring which rests upon the base 13 and a cylindrical skirt which surrounds the sleeve 28. A pinching out visible in FIG. 3 enables the skirt to compress radially under the effect of a pinching arrangement 33 whose circumferentially distributed jaws can slide over the external cylindrical wall of the skirt. The pinching out imparts to the connection between the ring and the skirt a high degree of rigidity in the direction of the axis 42 since displacement of the pinching arrangement 33 should not cause the vertical entrainment of the sleeve 28. The jaws of the pinching arrangement 33 have an internal cylindrical bearing surface matching the external wall of the skirt which guides the sleeve 28. The jaws of the pinching arrangement 33 bear externally on a taper bore in the base 13 through a spherical surface centered at A. The position of the centre A in relation to the centre B is chosen in such a fashion that the broken line joining the point of contact between the pinching arrangement 33 and the base, through the centre of thrust A, passes very close to the point of contact between the sleeve 28 and the skirt of the member 29. The bottom of the base 13 is constituted by a cover 37 which can rest on the transfer carriage 8 when the jacks 7 are in the lowered position. The cover 37 serves to carry a first set of springs 31 which tend to urge the sleeve 28 out of the base 13. This action on the part of the sleeve 28 enables a change in horizontal trim and an upward sliding motion to take place, the latter being limited by an internal edge on the ring of the member 29.

The cover 37 also serves to support a second set of springs 36 which exert a thrust on the base of the pinching arrangement 33 in order to relax the pinching force. The springs 36 cooperate with a toroidal elastic seal 35 which, in association with the back of the base of the pinching arrangement 33 and the bottom of the cover 37, delimits a cavity 34. By sucking out the air contained in the cavity 34, the toroidal seal 35 and the springs 36 are squashed. The displacement of the base of the pinching arrangement 33 means that the jaws move towards each other and consequently cause the sleeve 28 to be locked by the skirt of the member 29.

In FIG. 3, it can be seen how the mechanical indexing of the base 13 by the studs 10, 11 and 12, is brought about through the medium of the ring 14 which rests upon the base through medium of balls 30 arranged upon a circular track. This arrangement makes it possible to rotate the plate 22 about the axis 42. The partial isometric view of FIG. 4 shows how the ring 14 is maintained perfectly concentric in relation to the ring 39 through the agency of rollers 46.

FIG. 4 also shows, in greater detail, the shape of the pinching arrangement 33 and the rotary motion θ which, in FIG. 1, is controlled by the knob 26.

In FIG. 3, there can be seen in section the major elements which go to make up the pivoting flap 17. The loading area of the slab 19 is shown in contact with the flat face of the plate 22, that is to say the face in respect of which precise positioning is required. The loading area communicates with a vacuum chamber 39 which creates the necessary suction during the phase of inversion of the flap 17. At the edge of the loading area there can be seen the stop 21 which serves to position the plate 22 in its own plane. The mechanical indexing of the slab 19 is effected by the ball 20 whose centre passes through the reference plane 44 and is aligned with the axis 43 of the thrust rod 38 of the jack 7, said axis being shown in broken line.

The mechanical connection between the slab 19 and the flap 17 is in the form of a cover 41 containing a spring plate with springs 40. The cover 41 is connected to a control knob 18 through the agency of a helical cam. Rotation of the knob 18 in relation to the flap 17 causes the slab 19 to move downwards. The spring plate with its springs 40, ensures proper engagement of the mechanical indexing means 20 and 11, as well as proper seating of the plate 22 against the flat topped member 9.

In the foregoing, the case has been considered in which locking of the flat topped member 9 in the base 13 of the levelling stage is performed by compression of the cylindrical skirt through the agency of a pinching arrangement 33 operated pneumatically by a vacuum chamber.

Without departing from the scope of the invention, it is possible for example to arrange that it is the sleeve 28 which controls transfer from one to the other of the two operating states. Thus, the bore in the skirt can be dimensioned in such a fashion that in the absence of any stress developed in the sleeve 28, the latter is locked. To enable the sleeve 28 to slide, it is then necessary to exert an opposite force on the lateral wall of the sleeve 28. This force can be produced by means of an electromagnet, whose core, located at the centre of the sleeve, is surrounded by a polepiece forming an airgap in relation to the lateral wall of the sleeve. In this case, with a sleeve of ferromagnetic material and a winding arranged on the core, the passage of an energizing current can cause the latter to slide within the rigid cylindrical skirt. By cutting off the energizing current, the sleeve is immobilised by virtue of its own elastic restoring forces. It will therefore be seen that the invention is not limited to optical machines but can also be applied to electron-beam recording systems operating in the vacuum.

What we claim is:

1. A loading device for positioning a body having a flat face in a position such that said flat face coincides with a mechanically indexed reference plane, said device comprising: a mounting frame carrying mechanical indexing means defining said reference plane, a levelling stage for supporting said body, and fitting means for setting down said flat face in said position; said levelling stage comprising a base member, and a flat topped supporting member; said base member being provided with a cylindrical bore, and said supporting member having a spherical bearing surface slidably mounted within said cylindrical bore, said supporting member and said base member being clampable in fixed relation to each other; said levelling stage further comprising repulsion means for pushing said supporting member away from the bottom of said base member, and straining means, acting on one of said members for controlling the amount of clamping thereof.

2. A loading device as claimed in claim 1, wherein said base member is equipped with a cylindrical skirt containing said cylindrical bore; said straining means comprising a pinching arrangement equipped with several clamping jaws disposed circumferentially about the periphery of said cylindrical skirt; said jaws having outer faces bearing against a conical bearing surface formed in said base member; said outer faces being in the form of portions of a spherical surface.

3. A loading device as claimed in claim 2, wherein said pinching arrangement is actuated by pneumatic means comprising a vacuum chamber.

4. A loading device as claimed in claim 1, wherein said base member is in two parts which can rotate in relation to one another about an axis coincidental with the axis of said cylindrical bore.

5. A loading device as claimed in claim 3, wherein said vacuum chamber is delimited by a wall belonging to said pinching arrangement, a wall belonging to said base member, and a toroidal seal trapped between said walls.

6. A loading device as claimed in claim 1, wherein said flat topped supporting member is equipped with a loading stand communicating with a vacuum chamber in order to fix in position a said body arranged on said stand through the medium of a suction effect.

7. A loading device as claimed in claim 1, wherein further mechanical indexing means matching said mechanical indexing means are provided on said base member.

8. A loading device as claimed in claim 1, wherein the clamping of said members is brought about by predetermined elastic radial deformations; said predetermined elastic radial deformations being obtained by dimensioning said cylindrical bore to obtain a tight fit with said spherical bearing surface; said straining means causing said clamping to cease by cancelling out one of said predetermined elastic radial deformations undergone by one of said members through the medium of a supplementary elastic radial deformation created in the other of said members.

9. A loading device as claimed in claim 1, wherein said straining means are fluid pressure means.

10. A loading device as claimed in claim 7, wherein said fitting means comprise a pivoting flap with a flat loading area disposed parallel to a plane defined thereon by still further mechanical indexing means matching said mechanical indexing means, and thrust means for successively bringing about engagement between said further mechanical indexing means and each of said other mechanical indexing means.

11. A loading device as claimed in claim 10, wherein said thrust means comprise first thrust means fixed to the said mounting frame and second thrust means making it possible to displace a mobile slab carried by said pivoting flap; said slab comprising said loading area and said still further mechanical indexing means.

12. A loading device as claimed in claim 1, wherein said mechanical indexing means comprise a triangular arrangement of identical balls cooperating with a set of abutting studs forming a seating arrangement of the point, line, surface kind; the point, line, surface elements of said seating arrangement being each on different ones of said abutting studs.

13. A loading device as claimed in claim 10, wherein the loading area carried by said pivoting flap is equipped with stops designed to centre a said body.

14. A loading device as claimed in claim 10, wherein the loading area carried by said pivoting flap communicates with a vacuum chamber designed to bring about the pneumatic fixing of a said body under a suction effect.

15. A loading device as claimed in claim 12, wherein said first thrust means comprise a triangular arrangement of pneumatically controlled jacks; the strokes of said jacks being arranged so that engagement between said balls and said abutting studs takes place in the order: point, line, surface.

* * * * *